US 6,959,251 B2

(12) United States Patent
Coldren et al.

(10) Patent No.: US 6,959,251 B2
(45) Date of Patent: Oct. 25, 2005

(54) INSPECTION SYSTEM SETUP TECHNIQUES

(75) Inventors: David Bruce Coldren, San Jose, CA (US); Prashant A. Aji, San Jose, CA (US); David Winslow Randall, Redwood City, CA (US); Sharon Marie McCauley, San Jose, CA (US)

(73) Assignee: KLA-Tencor Technologies, Corporation, Milpitas, CA (US)

(*) Notice: Subject to any disclaimer, the term of this patent is extended or adjusted under 35 U.S.C. 154(b) by 11 days.

(21) Appl. No.: 10/298,389

(22) Filed: Nov. 14, 2002

(65) Prior Publication Data

US 2004/0038454 A1 Feb. 26, 2004

Related U.S. Application Data

(60) Provisional application No. 60/405,750, filed on Aug. 23, 2002.

(51) Int. Cl.$^7$ .......................... G06F 19/00; G06F 17/50
(52) U.S. Cl. ............................................ 702/83; 716/4
(58) Field of Search .......................... 702/83; 250/310; 438/122; 382/145; 716/4

(56) References Cited

U.S. PATENT DOCUMENTS

| | | | | |
|---|---|---|---|---|
| 5,539,752 A | * | 7/1996 | Berezin et al. | 714/724 |
| 5,598,341 A | * | 1/1997 | Ling et al. | 700/110 |
| 5,801,965 A | * | 9/1998 | Takagi et al. | 702/35 |
| 5,991,699 A | * | 11/1999 | Kulkarni et al. | 702/83 |
| 6,169,282 B1 | * | 1/2001 | Maeda et al. | 250/310 |
| 6,259,520 B1 | * | 7/2001 | Zeimantz | 356/237.4 |
| 6,300,629 B1 | * | 10/2001 | Lawrence | 250/310 |
| 6,393,602 B1 | * | 5/2002 | Atchison et al. | 716/4 |
| 6,407,386 B1 | * | 6/2002 | Dotan et al. | 250/310 |
| 6,426,501 B1 | * | 7/2002 | Nakagawa | 250/310 |
| 6,477,685 B1 | * | 11/2002 | Lovelace | 716/4 |
| 6,507,933 B1 | * | 1/2003 | Kirsch et al. | 716/4 |
| 6,542,830 B1 | * | 4/2003 | Mizuno et al. | 702/35 |
| 6,610,980 B2 | * | 8/2003 | Veneklasen et al. | 250/310 |
| 6,635,872 B2 | * | 10/2003 | Davidson | 250/307 |
| 6,674,890 B2 | * | 1/2004 | Maeda et al. | 382/149 |
| 6,826,735 B2 | * | 11/2004 | Ono et al. | 716/4 |

OTHER PUBLICATIONS

Usami et al., Semiconductor Inspection System for Yield Enhancement, 1999, Hitachi review, vol. 48, No. 6, pp. 354-360.*

* cited by examiner

*Primary Examiner*—John Barlow
*Assistant Examiner*—Toan M. Le
(74) *Attorney, Agent, or Firm*—Beyer, Weaver & Thomas, LLP.

(57) ABSTRACT

Techniques for efficiently setting up inspection, metrology, and review systems for operating upon semiconductor wafers are described. Specifically, this involves setting up recipes that allows each system to accurately inspect semiconductor wafers. The invention gathers pertinent information from these tools and presents the information to users in a way that greatly reduces the time required to complete a recipe. One system embodiment includes an inspection system and a review station that is communicatively linked such that the review station can read from and write to an entire set of data stored at the inspection system. The set of data includes image files of features detected by the inspection system.

18 Claims, 4 Drawing Sheets

INSPECTION SYSTEM SETUP TECHNIQUES

CROSS REFERENCE TO RELATED APPLICATIONS

This application claims priority of U.S. Provisional Patent Application No. 60/405,750, filed Aug. 23, 2002, which application is incorporated herein by reference in its entirety for all purposes.

FIELD OF THE INVENTION

The present invention relates generally to semiconductor inspection techniques, and more specifically to techniques for setting up the inspection apparatuses.

BACKGROUND OF THE INVENTION

Generally, the industry of semiconductor manufacturing involves highly complex techniques for integrating circuits into semiconductor materials. Due to the large scale of circuit integration and the decreasing size of semiconductor devices, the semiconductor manufacturing process is prone to processing defects. Testing procedures are therefore critical to maintain quality control. Since the testing procedures are an integral and significant part of the manufacturing process, the semiconductor industry constantly seeks more accurate and efficient testing procedures.

Typical inspection processes detect defects by comparing similar semiconductor device areas on a wafer. The differences detected between the two device areas can either be a defect, which can cause a device to function improperly, or a nuisance, which will not affect system operations. These differences can be referred to as feature differences. It is clear then, that an integral phase of semiconductor wafer inspection involves optimizing the settings, commonly referred to as the "recipe," of an inspection device so that it can accurately distinguish defects from nuisances.

Typically, semiconductor inspection devices are tuned by using a supplementary review station. FIG. 1 illustrates an exemplary semiconductor inspection system 100 that includes an inspection device 102 that is linked to a review station 104 through a database 106. The circled reference numbers in FIG. 1 describe basic steps of a routine for optimizing the recipe used on inspection device 102. The routine begins at step 1 where inspection device 102, an optical inspector for example, scans the semiconductor wafer, detects feature differences which could be either defects or nuisances, produces large amounts of data concerning these differences, and the person performing the set-up then notes which differences require higher resolution inspection in order to be categorized. Additionally, inspection device 102 produces graphical images, referred to as "patches," for each of the differences. The patches can have a range of pixel sizes. For example, a patch can be 32×32 or 64×64 pixels in size. At step 2, a subset of the data relating to feature differences that need to be categorized by review station 104 is arranged. This subset of data needs to be sent to review station 104, however, since inspection device 102 and review station 104 typically cannot interoperate smoothly, data transfer between the two devices must be sent via database 106.

Therefore, at step 3, the subset of data is transmitted to database 106 and then at step 4, the data is relayed to review station 104. Review station 104 can be, for example, a scanning electron microscope. At step 5, review station 104 has higher resolution imaging capabilities that are used to categorize the differences that could not be classified on inspection device 102. At step 6, the categorized data is sent back to database 106 and then at step 7, the categorized data is relayed back to inspection device 102. At step 8, inspection device 102 uses the newly categorized information to tune the recipe of inspection device 102. Since only a subset of the data relating to feature differences requiring further categorization was sent to review station 104 in step 3, a second subset of data requiring further categorization is arranged by repeating steps 2–8. This iteration process is repeated until the recipe for inspection device 102 is optimized to the point that inspection results having a desired confidence level is achieved. Once the recipe is optimized, the inspection device 102 is ready for use in a production environment. Generally, confidence levels are increased as the time spent optimizing recipes is increased. However, spending more time on optimization decreases the throughput of semiconductor fabrication processes.

As described in step 2, data transfer between inspection device 102 and review station 104 must go through database 106. This is required because the industry standard data transmission format limits the amount of data that is transmitted between inspection device 102 and review station 104. For example, the transmitted data includes only basic information such as feature difference identification numbers, x and y coordinates for each feature difference, size and defect class code data. Unfortunately, while this information is sent, a large amount of data residing at inspection device 102 cannot be sent to review station 104 for analysis purposes. Therefore, the configuration of the current the inspection systems limit the efficiency of the optimization process by limiting the accessibility of data.

In view of the foregoing, a semiconductor inspection system that can be easily and quickly optimized would be desirable.

BRIEF SUMMARY OF THE INVENTION

The present invention is directed to a system and techniques for efficiently setting up inspection, metrology, and review systems for operating upon semiconductor wafers. Specifically, this involves setting up recipes that allows each system to accurately inspect semiconductor wafers. The invention gathers pertinent information from these tools and presents the information to users in a way that greatly reduces the time required to complete a recipe.

One aspect of the present invention pertains to a semiconductor inspection system that includes an inspection system that compares at least two semiconductor device areas, determines differences between the device areas, generates a set of data corresponding to the differences, an inspection system memory unit, and a review station being communicatively linked to the inspection system such that the review station can read from and write to the entire set of data stored at the inspection system.

Another aspect of the present invention pertains to a method for optimizing a semiconductor inspection device that involves accessing an entire set of feature difference data that is stored at an inspection device directly from the review station. This method also involves categorizing features as either defects or nuisances. One implementation of the method involves accessing all of the graphical images stored at the inspection device directly from the review station.

Another aspect of the invention is directed to a semiconductor review station that includes a review station graphical user interface that allows a user to operate the review station, and an inspection device graphical user interface located at the review station that allows a user who is located at the review station to transmit and receive commands to and from an inspection device, which is communicatively linked to the review station.

These and other features and advantages of the present invention will be presented in more detail in the following specification of the invention and the accompanying FIGURES, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to a system and techniques for efficiently setting up inspection, metrology, and review systems for operating upon semiconductor wafers. Specifically, this involves setting up recipes that allows each system to accurately inspect semiconductor wafers. The invention gathers pertinent information from these tools and presents the information to users in a way that greatly reduces the time required to complete a recipe. This information can include components such as images, alignment targets, defect locations, set up parameters, and prior recipe history, e.g. session information.

Figure 1:
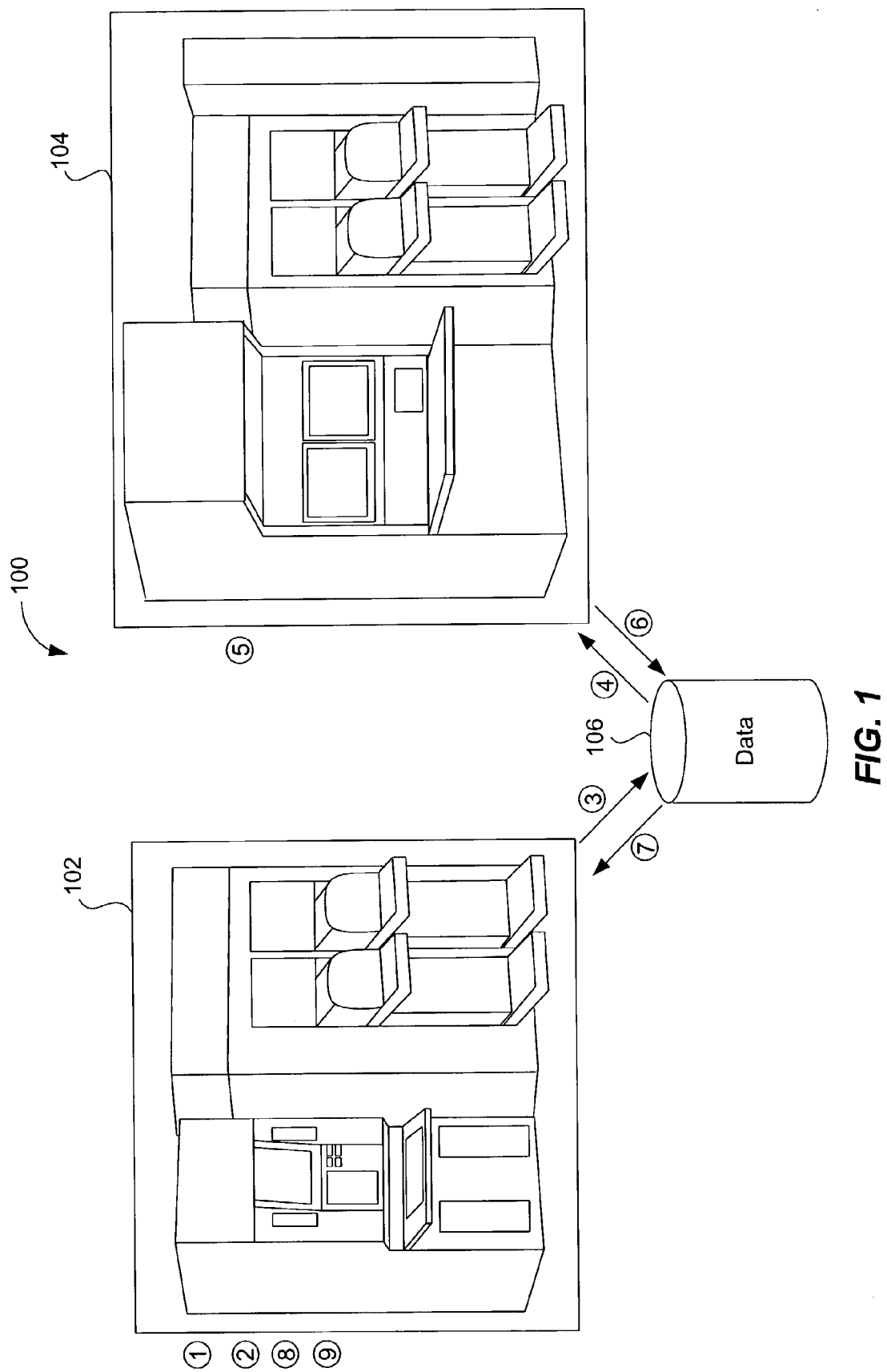
FIG. 1 illustrates an exemplary semiconductor inspection system that includes an inspection device that is linked to a review station through a database.
Figure 2:
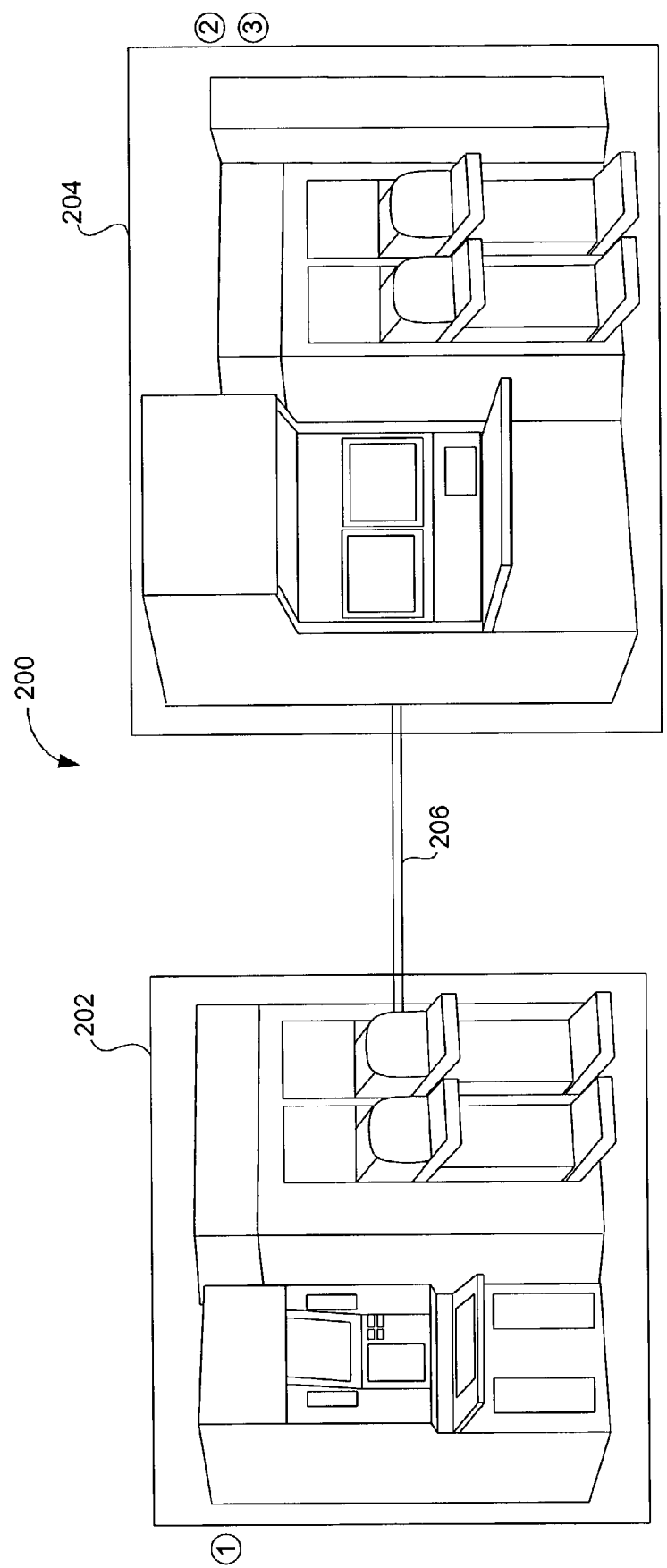
FIG. 2 illustrates a diagrammatic view of an inspection system according to one embodiment of the present invention.

FIG. 2 illustrates a diagrammatic view of an inspection system 200 according to one embodiment of the present invention. Inspection system 200 includes an inspection device 202 that is connected to a review station 204 through a communication channel 206. Inspection device 202 can be a variety of devices such as an optical inspection system or an inspection system based on an electron microscope. Review station 204 can be a variety of systems that include a scanning electron microscope. Communication channel 206 can be a variety of communication channels that include local area networks and wide area networks. Therefore, inspection device 202 and review station 204 can be located proximate to each other or they can be located in dispersed geographic locations. This allows for off-site personnel to remotely access inspection device 202 to optimize the recipe. In this case, communication channel 206 can be a secure link, for example, an encrypted channel. In some embodiments, a communication channel provided between different semiconductor fabrication plants promote matching of recipes at each plant. This also allows new fabrication plants to be brought on-line more quickly. Preferably, inspection device 202 and review station 204 run on compatible or the same operating systems so that interfacing between device 202 and station 204 is substantially seamless to the user.

Inspection system 200 is configured to efficiently optimize the recipe for inspection device 202 through the use of review station 204. Inspection system 200 provides a user located at review station 204 with access to the data and functionality available at inspection station 202. Such access provides data and functions that are in addition to the functions available at review station 204. For example, functions such as AutoSAT and WISE, can be utilized from review station 204. In one embodiment, a user can access the data and functions at the inspection station 202 through an inspection station graphical user interface provided at review station 204.

In FIG. 2, circled reference numbers 1 through 3 describe the operations for optimizing the recipe for inspection device 202 according to one embodiment of the present invention. In operation 1, inspection device 202 scans a semiconductor wafer and compares individual semiconductor device areas to find differences between each of the semiconductor device areas. Data relating to each of the feature differences (the features that are different within any two of the device areas) is collected. Inspection device 202 also performs other functions such as enabling a user to classify each of the feature differences as either a defect or a nuisance. The complete set of data relating to the feature differences is created in a "native file." This native file includes information such as, but not limited to identification number, x and y coordinates, feature size, class code, a patch, polarity, SAT segment, and magnitude. The review resolution limitations of inspection device 202 prevent the classification of all of the detected feature differences. Therefore, review station 204, which is capable of higher resolution imaging, is needed to review the differences that could not be classified by inspection device 202.

In operation 2, review station 204 accesses the entire native file at inspection device 202 and then reads data from the native file. Communication channel 206 provides review station 204 with complete access to the native file. Review station 204 can selectively read data relating to specific features that were different between semiconductor device areas. For instance, review station 204 can access all of the data relating to specific types of features or features within a specific area of a semiconductor wafer. Having access to the entire native file provides review station 204 with more information so that a quicker and more thorough review of features can be made at the review station. For instance, through communication channel 206, review station 204 can access all of the patch files located at inspection device 202. Patch files, which are the image files for each of the features located by inspection device 202, greatly reduce the time required for a technician/personnel at review station 204 to locate the features that require review. Generally, this is the case because the image files provide information in addition to x and y coordinates that greatly facilitates the process of locating specific features. In other words, providing both patches and coordinate information gives information redundancy that expedites the process of locating features on a wafer.

After reading data from inspection device 202, review station 204 locates and performs a high-resolution review of feature differences. This review process requires the semiconductor wafer to be transported from inspection device 202 to review station 204. Typically, review station 204 accesses data relating to the features that inspection device 202 was not able to categorize. After reviewing selected features on a semiconductor wafer, review station 204 categorizes the features as either defects or nuisances.

In operation 3, the recipe for inspection system 202 is optimized by incorporating the newly categorized data from review station 204 into the native file located at inspection device 202. This optimization is performed by transmitting update commands and the newly categorized data across communication channel 206 from review station 204 to the native file at inspection device 202. Review station 204 has the capability to access, and therefore write to, any portion of the native file located at inspection device 202. This is advantageous as any portion and category of data of the native file can be updated by review station 204. In contrast, current optimization process are capable of only updating selected types of data files within the native file due to the file transfer limitations between the inspection devices and the review stations.

The recipe at inspection device 202 can be optimized by executing operations 2 and 3 a single time each. In the execution of each operation, sufficient data can be transferred such that the inspection device 202 uses the recipe to accurately find defects on semiconductor wafers. In some implementations however, additional iterations of operations 2 and 3 are required to optimize the recipe to produce inspection results having sufficiently high confidence levels.

In some implementations, operations 2 and 3 are performed in parallel with each other. For example, while review station 204 reads data and then performs review on a set of feature differences, review station 204 can be optimizing the recipe at inspection device 202 with regards to another set of feature differences at the same time. In yet other implementations, operations 2 and 3 can begin even before inspection device 202 completes scanning semiconductor wafer in operation 1.

Review station 204 and inspection device 202 can be controlled through graphical user interfaces (GUIs) located at review station 204. A review station GUI allows the user to control the review station in order to review features on the semiconductor wafer. The review station GUI can also be used for the purposes of optimizing imaging conditions for a variety of semiconductor wafer surfaces.

Figure 3:
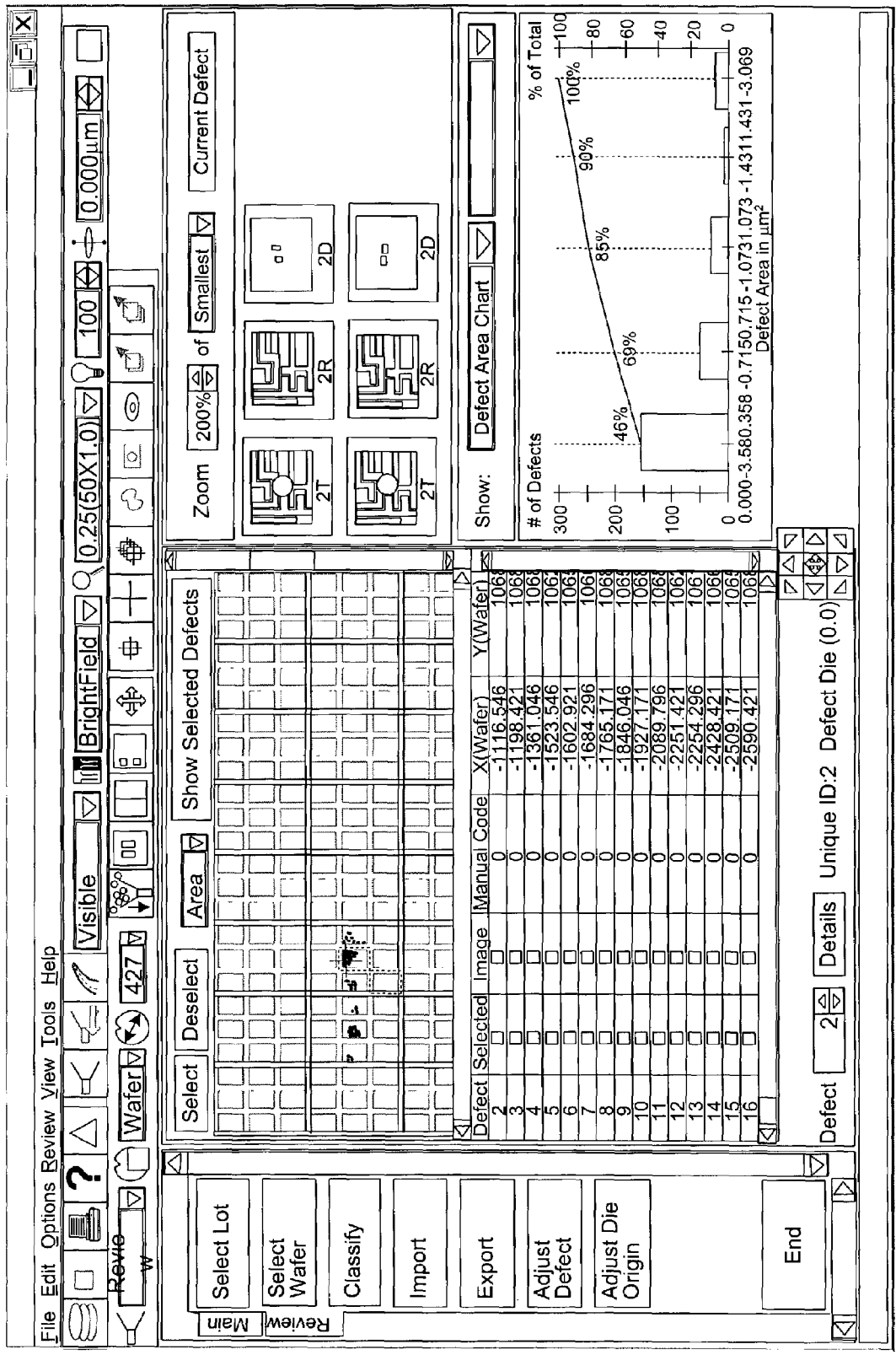
FIG. 3 illustrates an inspection device GUI according to one embodiment of the present invention.

Another graphical user interface located at review station 204 is the inspection device GUI, which allows the user to access the data stored on the inspection device 202 directly from review station 204. FIG. 3 illustrates an inspection device GUI 300 according to one embodiment of the present invention. For instance, from the inspection device GUI located at review station 204, review station 204 can access, read, and write to the entire native file. In one embodiment, the inspection device GUI at review station 204 is similar or the same as an inspection device GUI located directly at inspection station 202. In an alternative embodiment, inspection device GUI is generated through the use of an inspection device emulator. In this alternative embodiment, an inspection device GUI may or may not be displayed at inspection station 202. The inspection GUI can also perform other functions which are available on that software such as class code based sampling, wafer map zoom, unsupervised grouping, in-line automatic defect classification, and sorting and filtering by various criteria.

In one embodiment, the GUI for each of the inspection device and the review station are more user friendly because they are set up to have the same "look and feel." This means that the method for accessing and controlling functions for each system are similar to each other. In alternative embodiments, a single GUI can be used to control both the inspection device and the review station.

The configuration of inspection system 200 allows review station 204 to perform various functions using data from the entire native file on the inspection device 202. These functions include for example, sorting, classifying, filtering, sampling, class-code based sampling, and unsupervised grouping. The results from each of these functions are more effective for optimizing the recipe of inspection device 202 since the data set upon which the functions operate is larger.

Figure 4:
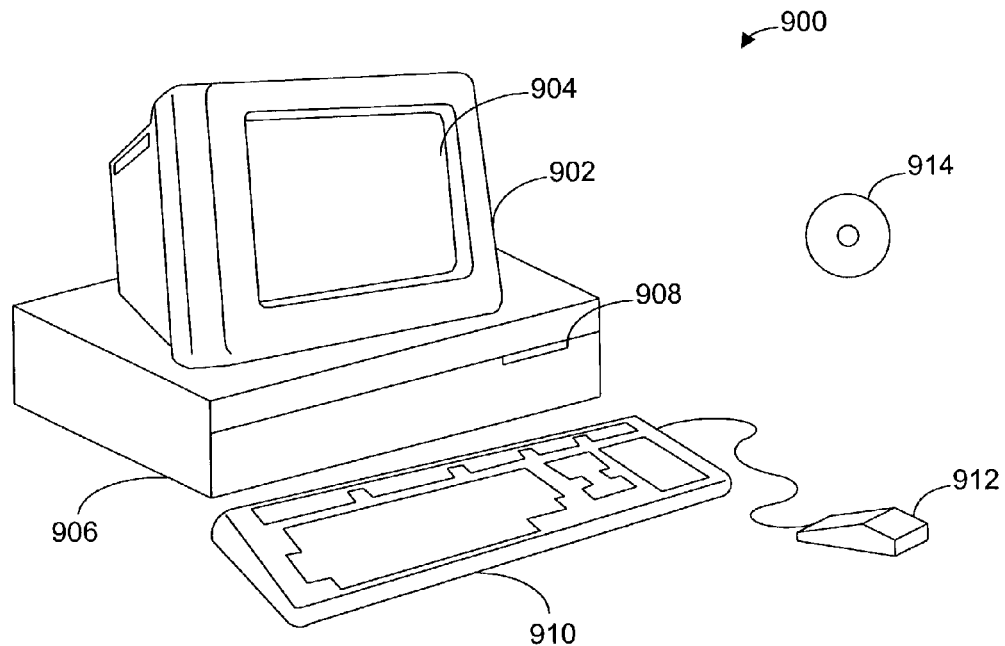
FIGS. 4 and 5 illustrate a computer system suitable for implementing embodiments of the present invention.
Figure 5:
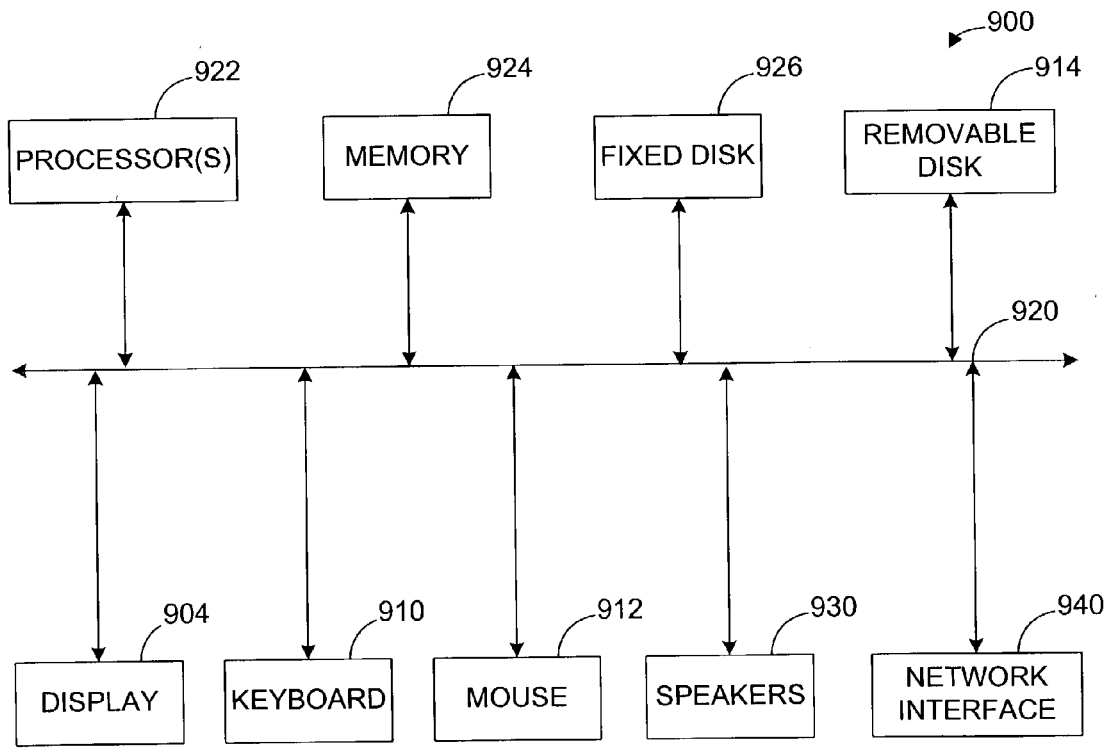

FIGS. 4 and 5 illustrate a computer system 900 suitable for implementing embodiments of the present invention. FIG. 4 shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 5 is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A semiconductor inspection and review system comprising:
an inspection system that compares at least two semiconductor device areas, determines differences between the device areas, and generates a set of data corresponding to the differences, wherein the set of data comprises a plurality of feature magnitudes and feature locations;
an inspection system memory unit that stores the set of data corresponding to the differences as a native file; and
a review station being communicatively linked to the inspection system such that the review station can read from and write to the set of data stored as the native file at the inspection system memory unit, categorize such differences within the set of data which cannot be classified on the inspection system, and optimize a recipe on the inspection station based on such categorized differences in order to enable the inspection station to more accurately distinguish between nuisances and defects;
thereby allowing the review station to directly process the set of data stored at the inspection system memory unit without using an intermediate database for transferring the set of data from the inspection system to the review station.

2. A semiconductor inspection and review system as recited in claim 1, wherein the set of data further comprises a plurality of image patches.

3. A semiconductor inspection and review system as recited in claim 1 wherein the inspection system is an optical inspection system and the review station is a scanning electron microscope.

4. A semiconductor inspection and review system as recited in claim 1 further comprising:
a local area network or a wide area network, which provides the communication link between the review station and the inspection system.

5. A semiconductor inspection system as recited in claim 1 wherein each of the inspection system and the review station run on compatible or the same operating systems so that interfacing between the inspection system and the review station is substantially seamless to a user.

6. A semiconductor inspection and review system as recited in claim 1, wherein the set of data further comprises a plurality of feature sizes, feature polarities and feature class codes.

7. A method for optimizing a semiconductor inspection station comprising:
scanning a semiconductor wafer with an inspection station, the semiconductor wafer having a plurality of similarly structured device areas;
detecting feature differences between pairs of the device areas;
generating a set of feature difference data comprising a plurality of feature magnitudes and feature locations;
storing the set of feature difference data at the inspection station as a native file;
accessing the native file representing the set of feature difference data directly from a review station;
reading data related to a first one of the feature differences within the entire set of feature difference data directly from the review station;
locating and reviewing, at the review station, the first feature difference;
categorizing the first feature difference as either a defect or a nuisance; and
incorporating the categorization of the first feature difference into the stored set of feature difference data;
thereby allowing the review station to directly process the native file representing the set of feature difference data stored at the inspection station without using a intermediate database for transferring the set of feature difference data from the inspection station to the review station.

8. A method as recited in claim 7, wherein the stored set of feature difference data comprises a plurality of image patches.

9. A method as recited in claim 8, wherein the stored set of feature difference data further comprises a plurality of feature sizes, feature polarities and feature class codes.

10. A method as recited in claim 7 further comprising:
generating a graphical image for each of the detected feature differences at the inspection station;
storing each of the graphical images at the inspection station;
accessing all of the graphical images directly from the review station; and
reviewing one of the graphical images directly from the review station in order to quickly locate an associated feature difference.

11. A method as recited in claim 7 further comprising:
performing classcode based sampling at the review station while utilizing the set of feature difference data at the inspection station.

12. A method as recited in claim 7 further comprising:
performing inline automatic defect classification at the review station while utilizing the set of feature difference data at the inspection station, whereby the inline automatic defect classification optimizes performance of the semiconductor inspection station.

13. A method as recited in claim 7 further comprising:
performing unsupervised grouping at the review station while utilizing the set of feature difference data at the inspection station.

14. A method as recited in claim 7 wherein the reading operation includes reading data of the types selected from the group consisting of polarity, SAT segment, and magnitude.

15. A method for optimizing a semiconductor inspection station comprising:

scanning a semiconductor wafer with an inspection station, the semiconductor wafer having plurality of similarly structured device areas;

detecting feature differences between pairs of the device areas;

generating a set of feature difference data comprising a plurality of feature magnitudes and feature locations;

storing the set of feature difference data at the inspection station;

accessing the set of feature difference data directly from a review station;

reading data related to a first one of the feature differences within the entire set of feature difference data directly from the review station;

locating and reviewing, at the review station, the first feature difference;

categorizing the first feature difference as either a defect or a nuisance;

incorporating the categorization of the first feature difference into the stored set of feature difference date; and optimizing a recipe for detecting feature differences at the inspection station based on the incorporated categorization of the first feature difference into the set of feature difference data so as to more accurately distinguish between nuisances and defects at the inspection station:

thereby allowing the review station to directly process the set of feature difference data stored at the inspection station without using an intermediate database for transferring the set of feature difference data from the inspection station to the review station.

16. A semiconductor review station comprising:

a review station graphical user interface that allows a user to operate the review station, the review station graphical user interface located at the review station; and a first inspection device graphical user interface located at the review station that allows a user who is located at the review station to directly process a native file stored at an inspection station and representing a set of feature difference data generated by the inspection station, without using an intermediate database for transferring the set of feature difference data from the inspection station to the review station;

wherein the set of feature difference data comprises a plurality of feature magnitudes, feature locations and image patches.

17. A semiconductor review station as recited in claim 16 wherein the review station is a scanning electron microscope and the inspection device is an optical inspection system.

18. A semiconductor review station as recited in claim 16 wherein the inspection device graphical user interface located at the review station is substantially the same as graphical user interface on the inspection station.

* * * * *

UNITED STATES PATENT AND TRADEMARK OFFICE
CERTIFICATE OF CORRECTION

PATENT NO. : 6,959,251 B2
DATED : October 25, 2005
INVENTOR(S) : Coldren et al.

It is certified that error appears in the above-identified patent and that said Letters Patent is hereby corrected as shown below:

Column 9,
Line 8, change "having plurality" to -- having a plurality --.
Line 26, change "difference date" to -- difference data --.

Column 10,
Line 29, change "same as" to -- same as a --.

Signed and Sealed this

Ninth Day of May, 2006

JON W. DUDAS
*Director of the United States Patent and Trademark Office*